US012701689B2

(12) United States Patent
Jung et al.

(10) Patent No.: US 12,701,689 B2
(45) Date of Patent: Aug. 4, 2026

(54) INTEGRATED CIRCUIT DEVICE AND METHOD OF MANUFACTURING THE SAME

(71) Applicant: Samsung Electronics Co., Ltd., Suwon-si (KR)

(72) Inventors: Kyooho Jung, Seoul (KR); Wonsik Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 404 days.

(21) Appl. No.: 18/348,864

(22) Filed: Jul. 7, 2023

(65) Prior Publication Data

US 2024/0015946 A1      Jan. 11, 2024

(30) Foreign Application Priority Data

Jul. 11, 2022      (KR) ........................ 10-2022-0085272

(51) Int. Cl.
| | |
|---|---|
| *H10B 12/00* | (2023.01) |
| *H10D 1/00* | (2025.01) |
| *H10D 1/68* | (2025.01) |
| *H10W 44/00* | (2026.01) |

(52) U.S. Cl.
CPC ........... *H10B 12/03* (2023.02); *H10B 12/033* (2023.02); *H10B 12/30* (2023.02); *H10B 12/315* (2023.02); *H10B 12/482* (2023.02); *H10D 1/042* (2025.01); *H10D 1/68* (2025.01); *H10D 1/696* (2025.01); *H10D 1/716* (2025.01); *H10W 44/601* (2026.01)

(58) Field of Classification Search
CPC ........ H10D 1/696; H10D 1/684; H10D 1/688; H10D 1/68; H10D 1/042; H01L 21/02189; H01L 21/02186; H10B 12/033; H10B 12/315; H10B 12/03; H10B 12/34; H10B 12/31; H10B 12/0335; H10B 12/00; H10B 12/30; H10B 12/482
See application file for complete search history.

(56) References Cited

U.S. PATENT DOCUMENTS

| | | | |
|---|---|---|---|
| 5,471,363 | A | 11/1995 | Mihara |
| 6,429,088 | B1 | 8/2002 | Lau |
| 8,574,999 | B2 | 11/2013 | Malhotra et al. |
| 8,575,671 | B2 | 11/2013 | Chen et al. |

(Continued)

FOREIGN PATENT DOCUMENTS

| | | |
|---|---|---|
| KR | 2014-0108616 A | 9/2014 |
| KR | 20200036600 A | 4/2020 |
| KR | 102148338 B1 | 8/2020 |

OTHER PUBLICATIONS

Korean Office Action for corresponding Korean Application No. 10-2022-0085272 dated May 7, 2026.

*Primary Examiner* — Jose R Diaz
(74) *Attorney, Agent, or Firm* — Harness, Dickey & Pierce, P.L.C.

(57) ABSTRACT

A method of manufacturing an integrated circuit device includes forming a plurality of lower electrodes above a substrate, forming a dielectric film on the plurality of lower electrodes, forming a doped upper interface film on the dielectric film, and forming an upper electrode on the doped upper interface film, wherein the doped upper interface film includes a dopant, and the dopant includes one selected from tin (Sn), molybdenum (Mo), niobium (Nb), tantalum (Ta), and aluminum (Al).

12 Claims, 20 Drawing Sheets

(56) References Cited

U.S. PATENT DOCUMENTS

| | | | |
|---|---|---|---|
| 8,581,318 B1 | 11/2013 | Chen et al. | |
| 8,741,712 B2 | 6/2014 | Chiang et al. | |
| 10,964,614 B2 | 3/2021 | Lee et al. | |
| 11,973,106 B2 * | 4/2024 | Song | H10D 1/696 |
| 2012/0061800 A1 | 3/2012 | Hirota | |
| 2014/0327062 A1 | 11/2014 | Park et al. | |
| 2020/0105633 A1 * | 4/2020 | Lee | H01L 23/5329 |
| 2021/0134803 A1 | 5/2021 | Cho et al. | |
| 2021/0265458 A1 | 8/2021 | Song et al. | |

* cited by examiner

S10

START

FORM GATE STRUCTURE AND CONTACT STRUCTURE ON SUBSTRATE — S110

FORM LOWER ELECTRODE ON CONTACT STRUCTURE — S120

FORM SUPPORTER CONTACTING SIDE WALL OF LOWER ELECTRODE — S130

FORM DIELECTRIC FILM ON LOWER ELECTRODE AND SUPPORTER — S140

FORM DOPED UPPER INTERFACE FILM ON DIELECTRIC FILM — S150

FORM UPPER ELECTRODE ON DOPED UPPER INTERFACE FILM — S160

END

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0085272, filed on Jul. 11, 2022, in the Korean Intellectual Property Office, the disclosure of which is incorporated by reference herein in its entirety.

BACKGROUND

The inventive concepts relate to integrated circuit devices and/or methods of manufacturing the same, and more particularly, to integrated circuit devices including a capacitor and/or methods of manufacturing the integrated circuit device.

With the recent rapid development of the semiconductor process technology, the high integration of integrated circuit devices has been accelerated, and the area of each cell has decreased. Accordingly, an area that may be occupied by a capacitor in each cell has also decreased. For example, with the increase in the integration density of integrated circuit devices, such as dynamic random access memory (DRAM), the area of each cell has decreased while maintaining or increasing capacitance. Thus, a structure for maintaining desired electrical characteristics by overcoming the spatial limit of a capacitor and the limit of design rules and increasing the capacitance of the capacitor is desired.

SUMMARY

Some aspects of the inventive concepts provide methods of manufacturing an integrated circuit device, by which leakage current flowing through a capacitor dielectric film between an upper electrode and a lower electrode is decreased by forming a doped upper interface film, which is doped with a very small amount of dopants using atomic layer deposition (ALD), at the interface between the capacitor dielectric film and the upper electrode with.

The inventive concepts are not limited to what is mentioned above and will be clearly understood by those skilled in the art from the descriptions below.

According to an aspect of the inventive concepts, there is provided a method of manufacturing an integrated circuit device. The method includes forming a plurality of lower electrodes above a substrate, forming a dielectric film on the plurality of lower electrodes, forming a doped upper interface film on the dielectric film, and forming an upper electrode on the doped upper interface film, wherein the doped upper interface film includes a dopant, and the dopant includes one selected from tin (Sn), molybdenum (Mo), niobium (Nb), tantalum (Ta), and aluminum (Al).

According to another aspect of the inventive concepts, there is provided a method of manufacturing an integrated circuit device. The method includes forming a plurality of lower electrodes above a substrate, forming a supporter configured to support the plurality of lower electrodes, forming a dielectric film on the plurality of lower electrodes and the supporter, forming a doped upper interface film on the dielectric film, and forming an upper electrode on the doped upper interface film, wherein the doped upper interface film includes one selected from InOx doped with tin (Sn), TiOx doped with niobium (Nb), SnOx doped with tantalum (Ta), TiOx doped with Ta, and TiOx doped with molybdenum (Mo).

According to a further aspect of the inventive concepts, there is provided a method of manufacturing an integrated circuit device. The method includes forming an isolation film defining an active region in a substrate, forming a gate structure crossing the active region and extending in a first direction, forming a source/drain in the active region respectively at opposite sides of the gate structure, forming a bit line structure extending in a second direction that is perpendicular to the first direction, forming a plurality of contact structures on the source/drain, respectively, forming a plurality of lower electrodes on the plurality of contact structures, respectively, forming a supporter configured to support the plurality of lower electrodes, forming a dielectric film on the plurality of lower electrodes and the supporter, forming a doped upper interface film on the dielectric film, and forming an upper electrode on the doped upper interface film, wherein the doped upper interface film includes a dopant, and the dopant includes one selected from tin (Sn), molybdenum (Mo), niobium (Nb), tantalum (Ta), and aluminum (Al).

BRIEF DESCRIPTION OF THE DRAWINGS

Example embodiments will be more clearly understood from the following detailed description taken in conjunction with the accompanying drawings in which.

DETAILED DESCRIPTION

Hereinafter, some example embodiments are described in detail with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof.

Figure 1:
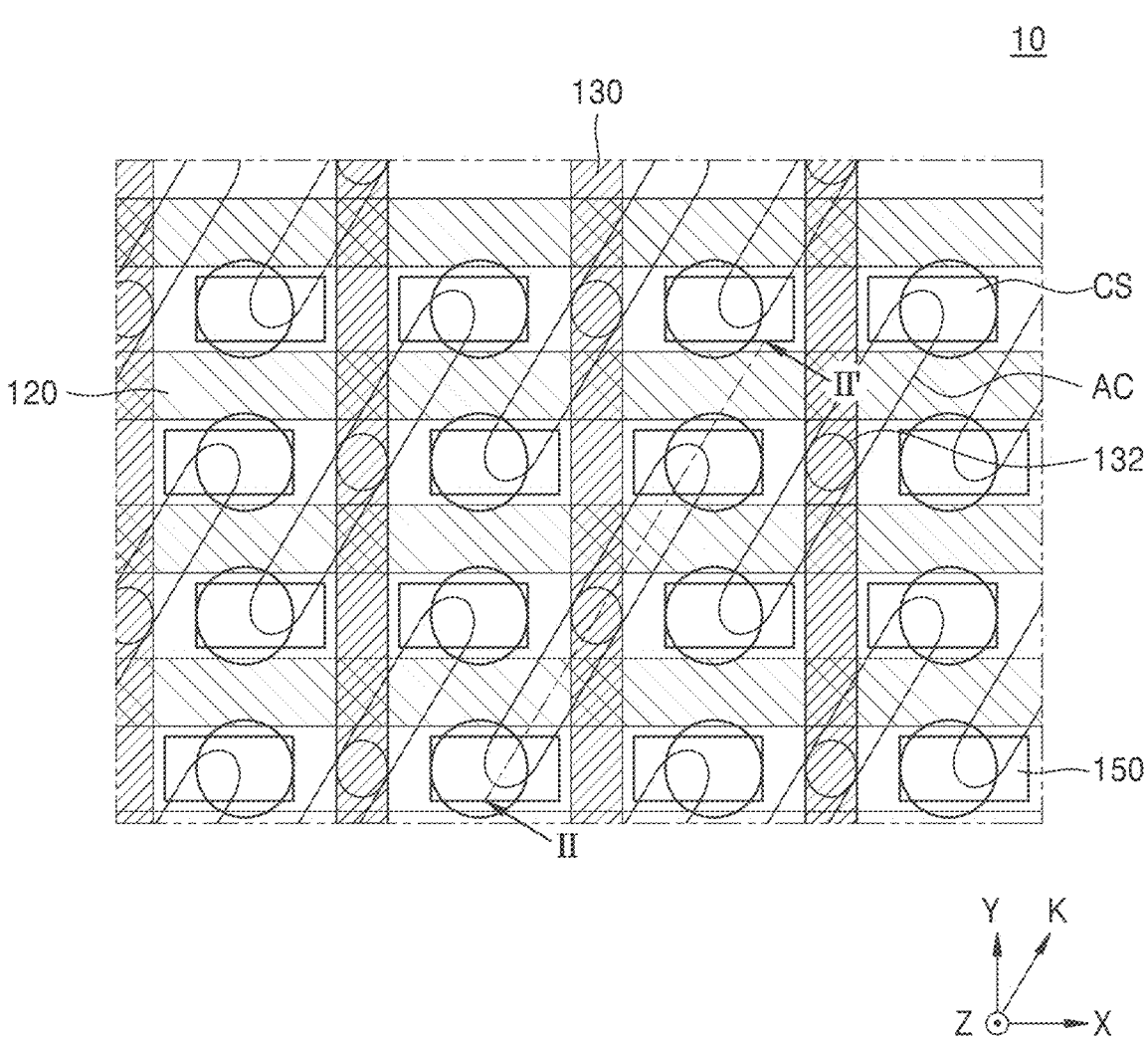
FIG. 1 is a layout diagram of an integrated circuit device according to an example embodiment.
Figure 2:
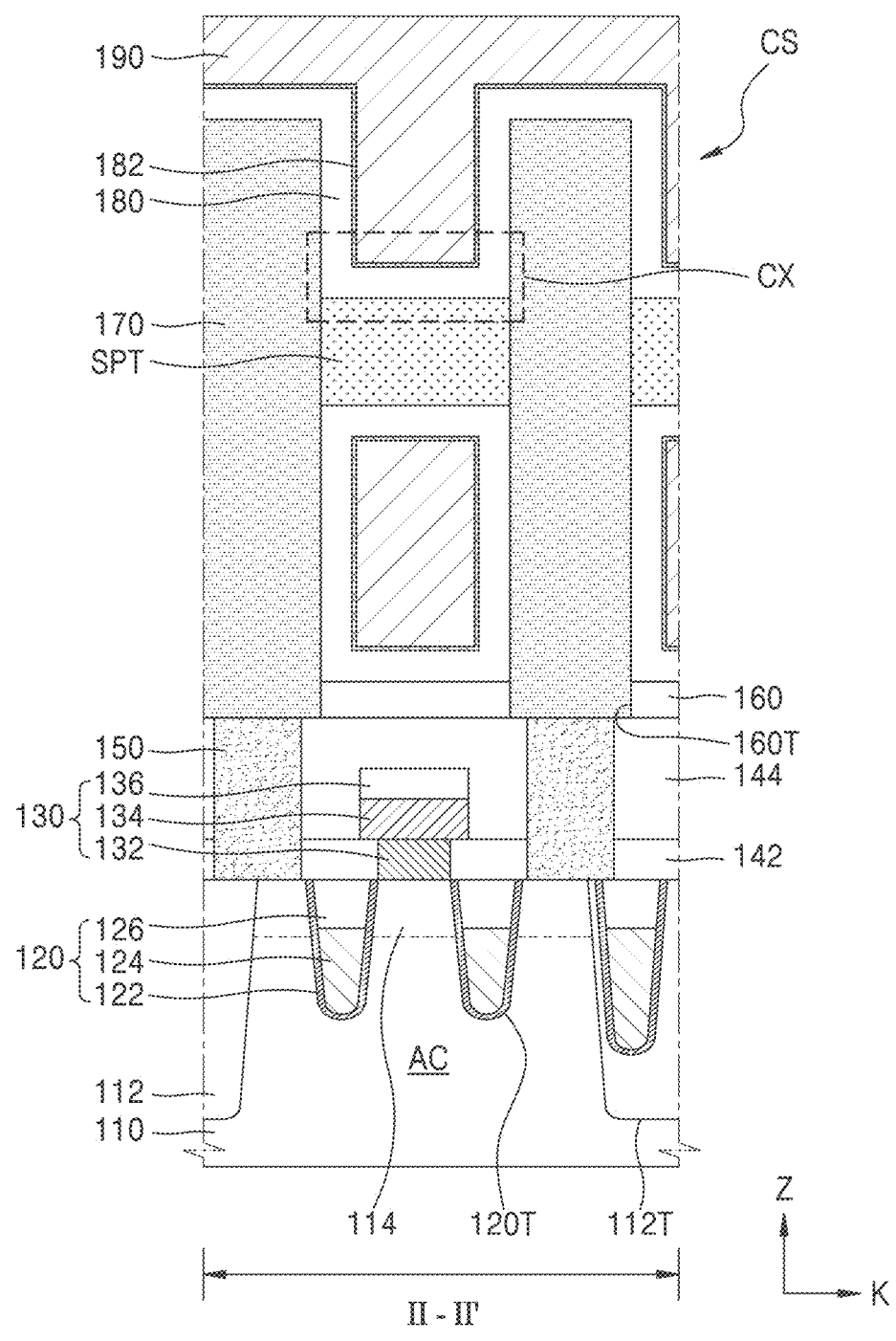
FIG. 2 is a cross-sectional view of an integrated circuit device according to an example embodiment.
Figure 3:
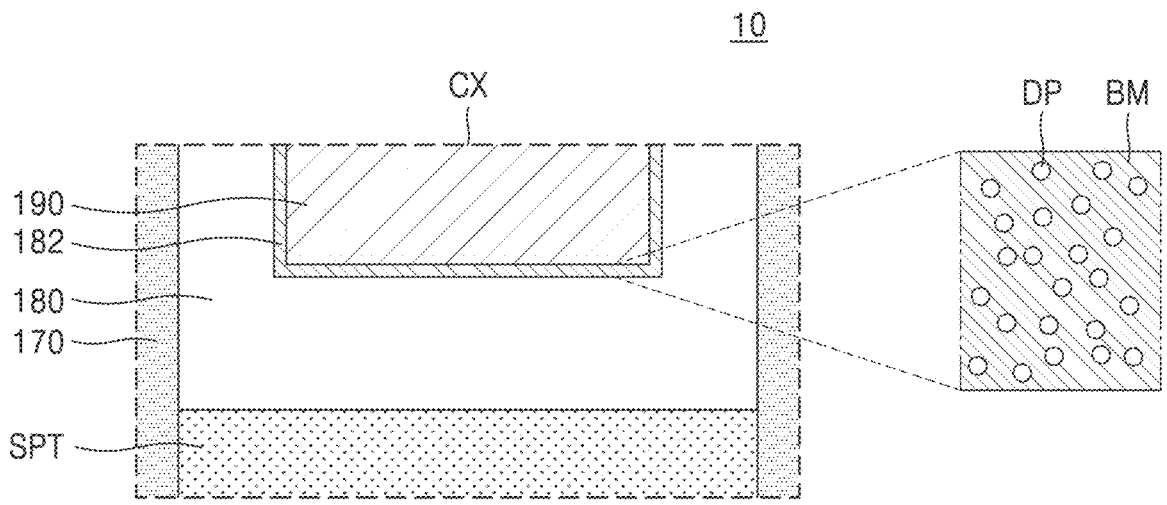
FIG. 3 is an enlarged cross-sectional view of a region CX in FIG. 2.

FIG. 1 is a layout diagram of an integrated circuit device 10 according to an example embodiment, FIG. 2 is a cross-sectional view taken along a line II-IT in FIG. 1, and FIG. 3 is an enlarged view of a region CX in FIG. 2.

Referring to FIGS. 1 to 3, the integrated circuit device 10 may include a lower electrode 170 above a substrate 110, a dielectric film 180 on the lower electrode 170, a doped upper interface film 182 on the dielectric film 180, and an upper electrode 190 on the doped upper interface film 182.

The substrate 110 may include an active region AC defined by an isolation film 112. The substrate 110 may correspond to a wafer including silicon (Si). In some example embodiments, the substrate 110 may correspond to a wafer including a semiconductor element (e.g., germanium (Ge)) or a compound semiconductor (e.g., silicon carbide (SiC), gallium arsenide (GaAs), indium arsenide (InAs), or indium phosphide (InP)). The substrate 110 may have a silicon on insulator (SOI) structure. The substrate 110 may include a conductive region (e.g., an impurity-doped well or an impurity-doped structure).

For example, the isolation film 112 may have a shallow trench isolation (STI) structure. The isolation film 112 may include an insulating material filling an isolation trench 112T in the substrate 110. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ) but is not limited thereto.

The active region AC may have a relatively long island shape (e.g., an elongated island shape). The long axis of the active region AC may be arranged in a K-direction that is parallel with a top surface of the substrate 110. The active region AC may be doped with p-type or n-type impurities.

The substrate 110 may include a gate line trench 120T extending in an X-direction. The gate line trench 120T may cross the active region AC and have a certain depth from the top surface of the substrate 110. A portion of the gate line trench 120T may extend to the inside of the isolation film 112. The bottom of a gate line trench 120T in the isolation film 112 may be at a lower level than the bottom of a gate line trench 120T in the active region AC.

A source/drain region 114 may be on the active region AC at each of opposite sides of a gate line trench 120T. The source/drain region 114 may include an impurity region, which is doped with impurities of a different conductivity type than the active region AC. The source/drain region 114 may be doped with n-type or p-type impurities.

A gate structure 120 may be formed in the gate line trench 120T. The gate structure 120 may include a gate insulating layer 122, a gate electrode layer 124, and a gate capping layer 126, which are sequentially formed on the inner wall of the gate line trench 120T.

The gate insulating layer 122 may be conformally formed on the inner wall of the gate line trench 120T to a certain thickness. The gate insulating layer 122 may include at least one selected from silicon oxide, silicon nitride, silicon oxynitride, oxide/nitride/oxide (ONO), and a high-k material having a higher dielectric constant than silicon oxide.

The gate electrode layer 124 may be formed on the gate insulating layer 122 to fill the gate line trench 120T up to a certain height from the bottom of the gate line trench 120T. The gate electrode layer 124 may include a work function control layer (not shown) on the gate insulating layer 122 and a buried metal layer (not shown) on the work function control layer, wherein the buried metal layer fills a bottom portion of the gate line trench 120T.

The gate capping layer 126 may be on the gate electrode layer 124 and may fill the remaining portion of the gate line trench 120T. For example, the gate capping layer 126 may include at least one selected from silicon oxide, silicon oxynitride, and silicon nitride.

A bit line structure 130 may be on the source/drain region 114 and may extend in a Y-direction that is perpendicular to the X-direction. The bit line structure 130 may include a bit line contact 132, a bit line 134, and a bit line capping layer 136, which are sequentially stacked on the substrate 110. For example, the bit line contact 132 may include polysilicon, the bit line 134 may include a metal material, and the bit line capping layer 136 may include silicon nitride or silicon oxynitride.

A first interlayer insulating film 142 may be on the substrate 110. The bit line contact 132 may pass through the first interlayer insulating film 142 to be connected to the source/drain region 114. The bit line 134 and the bit line capping layer 136 may be on the first interlayer insulating film 142. A second interlayer insulating film 144 may be on the first interlayer insulating film 142 and may cover the side surfaces of the bit line 134 and the side and top surfaces of the bit line capping layer 136.

A contact structure 150 may be on the source/drain region 114. The first and second interlayer insulating films 142 and 144 may surround the side wall of the contact structure 150. In some example embodiments, the contact structure 150 may include a lower contact (not shown), a metal silicide layer (not shown), and an upper contact (not shown), which are sequentially stacked on the substrate 110.

A capacitor structure CS may be on the second interlayer insulating film 144. The capacitor structure CS may include the lower electrode 170 electrically connected to the contact structure 150, the dielectric film 180 conformally covering the lower electrode 170, and the upper electrode 190 on the dielectric film 180. An etch stop film 160 having an opening 160T may be on the second interlayer insulating film 144, and a bottom portion of the lower electrode 170 may be in the opening 160T of the etch stop film 160.

It is illustrated that a plurality of capacitor structures CS are respectively arranged on a plurality of contact structures 150, which are repeatedly arranged in the X- and Y-directions, but example embodiments are not limited thereto. Differently, a plurality of capacitor structures CS may be arranged in a honeycomb pattern on a plurality of contact structures 150, which are repeatedly arranged in the X- and Y-directions.

The lower electrode 170 may include metal nitride, metal, or a combination thereof. For example, the lower electrode 170 may include at least one selected from TiN, TaN, WN, Ru, Pt, and Ir. The lower electrode 170 may be formed by chemical vapor deposition (CVD) or atomic layer deposition (ALD).

The lower electrode 170 may have a very large aspect ratio. For example, the aspect ratio of the lower electrode 170 may be about 10 to about 30. For example, the diameter of the lower electrode 170 may be about 20 nm to about 100 nm, and the height of the lower electrode 170 may be about 500 nm to about 4000 nm, but the lower electrode 170 is not limited thereto. As the lower electrode 170 has a large aspect ratio, the lower electrode 170 may collapse or break.

A supporter SPT may mitigate or prevent the lower electrode 170 from collapsing or breaking. The supporter SPT may have a plate shape including a supporter pattern in contact with the lower electrode 170. As an insulating film, the supporter SPT may include, for example, silicon oxide, silicon nitride, or silicon oxynitride.

The dielectric film 180 may surround the lower electrode 170 and the supporter SPT. The dielectric film 180 may include a high-k material having a higher dielectric constant than silicon oxide. For example, the dielectric film 180 may have a dielectric constant of about 10 to about 25. For example, the dielectric film 180 may include zirconium oxide ($ZrO_2$).

In an example embodiment, the doped upper interface film 182 may conformally surround the dielectric film 180. For example, the doped upper interface film 182 may be at the interface between the dielectric film 180 and the upper electrode 190.

The doped upper interface film 182 may include a base material BM doped with a very small amount of dopants DP. In some example embodiments, the dopants DP may be uniformly distributed in the base material BM.

For example, the dopants DP may include tin (Sn), molybdenum (Mo), niobium (Nb), tantalum (Ta), or aluminum (Al). For example, the base material BM may include $InO_x$, $TiO_x$, $SnO_x$, or $ZnO_x$. For example, the doped upper interface film 182 may include Sn-doped $InO_x$, Nb-doped $TiO_x$, Ta-doped $SnO_x$, Ta-doped $TiO_x$, or Mo-doped $TiO_x$. In some example embodiments, the doped upper interface film 182 may correspond to a transparent electrode having a high work function (e.g., a work function greater than 4 eV).

The thickness of the doped upper interface film 182 may be much less than the thickness of the dielectric film 180 and may be less than or equal to, for example, about 1 nm but is not limited thereto.

In an example embodiment, the doped upper interface film 182 may be formed by alternately performing first and second ALD processes, which include different precursors from each other such that the doped upper interface film 182 includes a very small amount of dopants DP. This is described in detail below.

The upper electrode 190 may be in direct contact with the doped upper interface film 182. The upper electrode 190 may cover the lower electrode 170 with the dielectric film 180 and the doped upper interface film 182 between the upper electrode 190 and the lower electrode 170. The upper electrode 190 may include metal nitride, metal, or a combination thereof. For example, the upper electrode 190 may include at least one selected from TiN, TaN, WN, Ru, Pt, and Ir.

With the recent rapid development of the semiconductor process technology, the high integration density of the integrated circuit device 10 has been accelerated, and the area of each cell has decreased. Accordingly, an area that may be occupied by a capacitor structure CS in each cell has also decreased. For example, with the increase in the integration density of the integrated circuit device 10, such as dynamic random access memory (DRAM), the area of each cell has decreased while maintaining or decreasing capacitance.

Therefore, in a structure in which the lower electrode 170 and the upper electrode 190 are very close to each other because of the decrease in the area of each cell, leakage current may undesirably flow through the dielectric film 180.

In other words, a structure for maintaining desired electrical characteristics by overcoming the spatial limit of the integrated circuit device 10 having a high integration density and the limit of design rules and increasing the capacitance of the integrated circuit device 10 is being desired.

According to some example embodiments of the inventive concepts, to reduce leakage current flowing through the dielectric film 180 in the integrated circuit device 10, the doped upper interface film 182 may be formed between the dielectric film 180 and the upper electrode 190 by using the base material BM doped with a very small amount of dopants DP.

Thus, leakage current flowing through the dielectric film 180 between the lower electrode 170 and the upper electrode 190 may be reduced in the integrated circuit device 10 by forming the doped upper interface film 182 at the interface between the dielectric film 180 and the upper electrode 190 by using ALD, in which a very small amount of dopants DP is supplied as a precursor.

Figure 4:
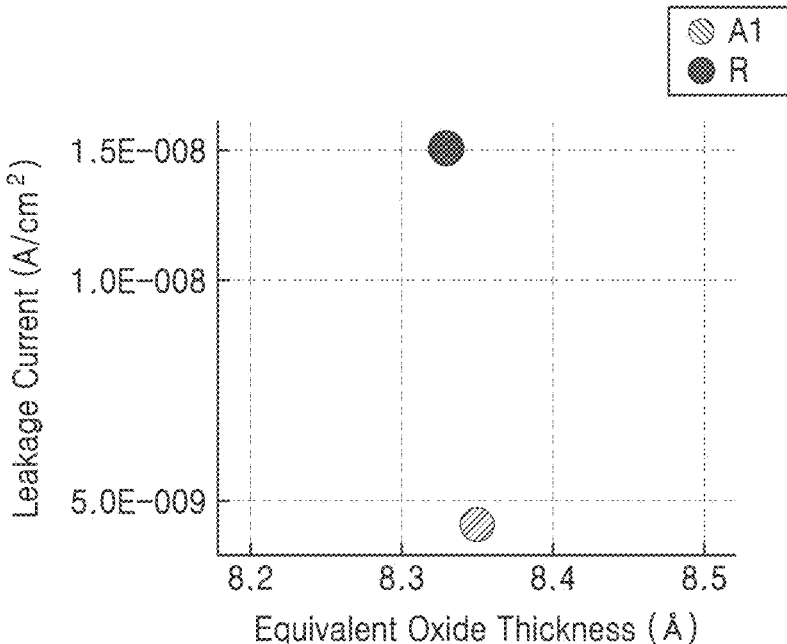
FIGS. 4 and 5 are graphs showing leakage current characteristics of an integrated circuit device, according to some example embodiments.
Figure 5:
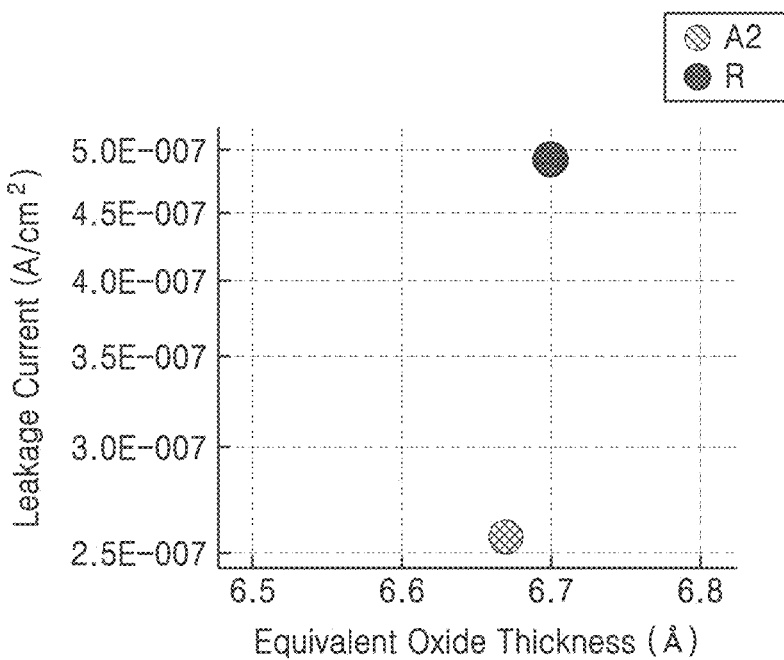

Characteristics of the integrated circuit device 10 according to some example embodiments of the inventive concepts are described below. FIGS. 4 and 5 are graphs each showing a comparison of leakage current in experimental examples according to some example embodiments with leakage current in comparative example.

FIG. 4 shows leakage current characteristics of an experimental example A1, in which an upper interface film has been doped and a comparative example R. Here, Sn-doped $InO_x$ was used as the upper interface film in the experimental example A1, and undoped $TiO_x$ was used as the upper interface film in the comparative example R.

Referring to FIG. 4, through the comparison between the experimental example A1 and the comparative example R, it is seen that the equivalent oxide thickness (the horizontal axis) of the dielectric film 180 (see FIG. 2) including the doped upper interface film 182 (see FIG. 2) in the experimental example A1 is similar to that of the comparative example R, but the leakage current (the vertical axis) in experimental example A1 is lower than that of the comparative example R.

FIG. 5 shows leakage current characteristics of an experimental example A2, in which an upper interface film is doped and a comparative example R. Here, Nb-doped $TiO_x$ was used as the upper interface film in the experimental example A1, and undoped $TiO_x$ was used as the upper interface film in the comparative example R.

Referring to FIG. 5, through the comparison between the experimental example A2 and the comparative example R, it is seen that the equivalent oxide thickness (the horizontal axis) of the dielectric film 180 (see FIG. 2) including the doped upper interface film 182 (see FIG. 2) in the experimental example A2 is similar to that of the comparative example R, but leakage current (the vertical axis) in the experimental example A2 is lower than that of the comparative example R.

Figure 6:
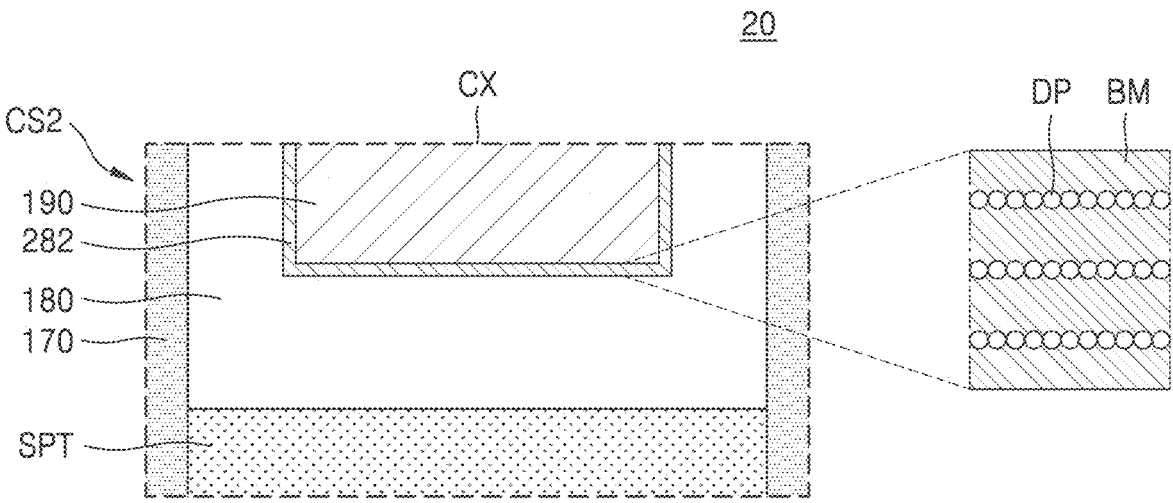
FIGS. 6 and 7 are cross-sectional views of integrated circuit devices according to an example embodiment.
Figure 7:
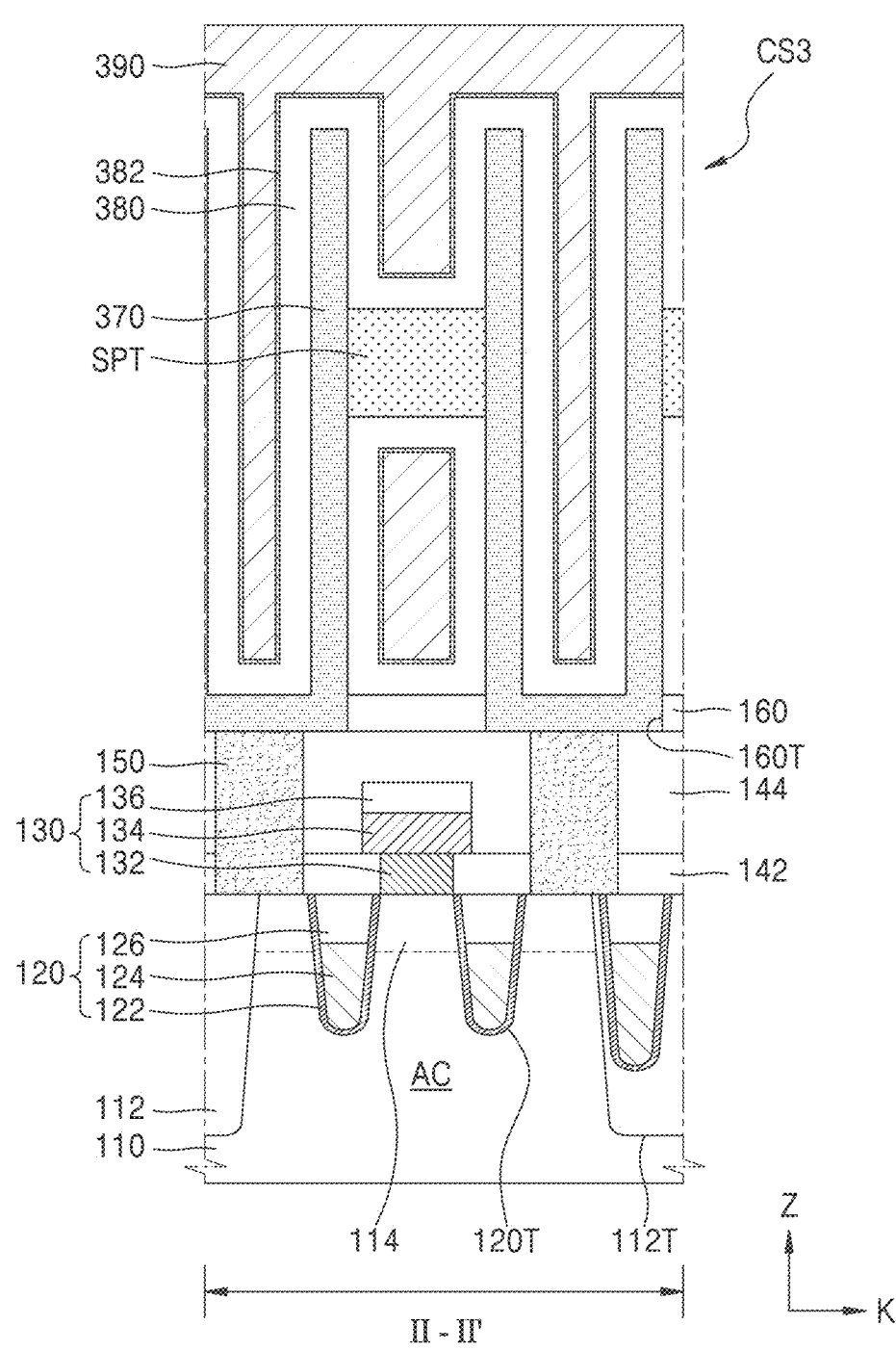

FIGS. 6 and 7 are cross-sectional views of integrated circuit devices 20 and 30 according to an example embodiment.

The elements of the integrated circuit devices 20 and 30 and the materials of the elements described below are the same as or substantially similar to those described above with reference to FIGS. 1 to 3. For convenience of description, therefore, the integrated circuit devices 20 and 30 are described focusing on the differences from the integrated circuit device 10.

Referring to FIG. 6, the integrated circuit device 20 may include a capacitor structure CS2, which includes the lower electrode 170, the dielectric film 180 on the lower electrode 170, a doped upper interface film 282 on the dielectric film 180, and the upper electrode 190 on the doped upper interface film 282.

In an example embodiment, the doped upper interface film 282 may conformally surround the dielectric film 180. For example, the doped upper interface film 282 may be at the interface between the dielectric film 180 and the upper electrode 190.

The doped upper interface film 282 may include the base material BM doped with a very small amount of dopants DP. In some example embodiments, the dopants DP may form layers at regular intervals in the base material BM.

For example, the dopants DP may include Sn, Mo, Nb, Ta, or Al. For example, the base material BM may include $InO_x$, $TiO_x$, $SnO_x$, or $ZnO_x$. For example, the doped upper interface film 282 may include Sn-doped $InO_x$, Nb-doped $TiO_x$, Ta-doped $SnO_x$, Ta-doped $TiO_x$, or Mo-doped $TiO_x$. In some example embodiments, the doped upper interface film 282 may correspond to a transparent electrode having a high work function (e.g., a work function greater than 4 eV).

The thickness of the doped upper interface film 282 may be much less than the thickness of the dielectric film 180 and may be less than or equal to, for example, about 1 nm but is not limited thereto.

In an example embodiment, the doped upper interface film 282 may be formed by an ALD process including a supercycle such that the doped upper interface film 282 includes a very small amount of dopants DP. This is described in detail below.

Referring to FIG. 7, the integrated circuit device 30 may include a capacitor structure CS3, which includes a lower electrode 370, a dielectric film 380 on the lower electrode 370, a doped upper interface film 382 on the dielectric film 380, and an upper electrode 390 on the doped upper interface film 382.

The lower electrode 370 of the integrated circuit device 30 may have a cylindrical or cup shape with a closed bottom on the contact structure 150.

When the lower electrode 370 has a cylindrical shape, the surface area of the lower electrode 370 corresponding to a storage electrode may be increased, and accordingly, the capacitance of the capacitor structure CS3 may increase.

In an example embodiment, the doped upper interface film 382 may conformally surround the dielectric film 380. For example, the doped upper interface film 382 may be at the interface between the dielectric film 380 and the upper electrode 390.

FIGS. 8 to 11 are flowcharts of a method of manufacturing an integrated circuit device, according to an example embodiment.

According to some example embodiments, the order of operations may be different from the order in which the operations are described. For instance, two operations described as being performed sequentially may be performed simultaneously or in a reverse order.

Figure 8:
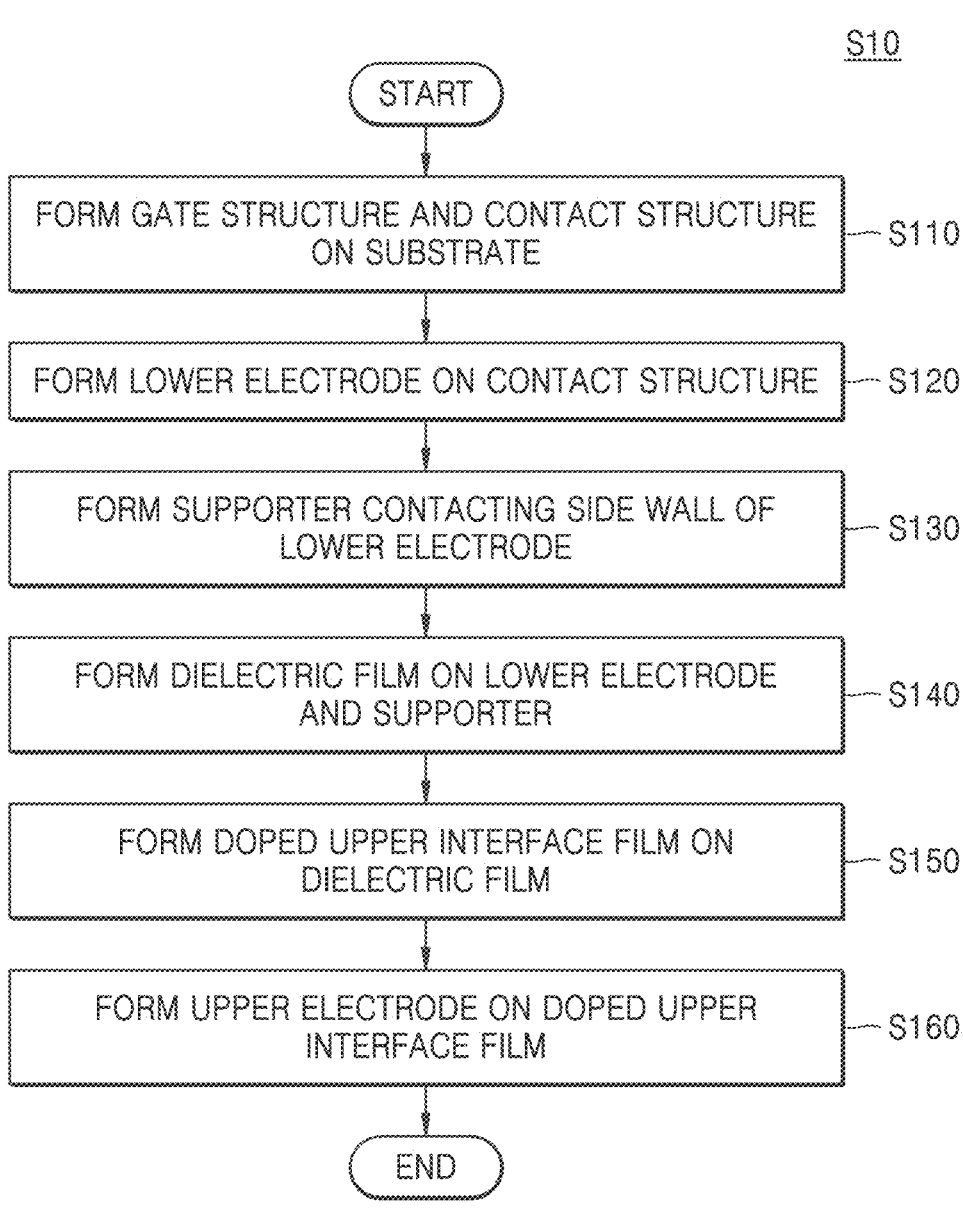
FIGS. 8 to 11 are flowcharts of a method of manufacturing an integrated circuit device, according to an example embodiment.

Referring to FIG. 8, a method S10 of manufacturing an integrated circuit device may include operations S110 to S160, which are performed sequentially.

The method S10 may include forming a gate structure and a contact structure on a substrate in operation S110, forming a lower electrode on the contact structure in operation S120, forming a supporter contacting a side wall of the lower electrode in operation S130, forming a dielectric film on the lower electrode and the supporter in operation S140, forming a doped upper interface film on the dielectric film in operation S150, and forming an upper electrode on the doped upper interface film in operation S160.

The technical characteristics of operations S110 to S160 are described in detail below with reference to FIGS. 12 to 19.

Figure 9:
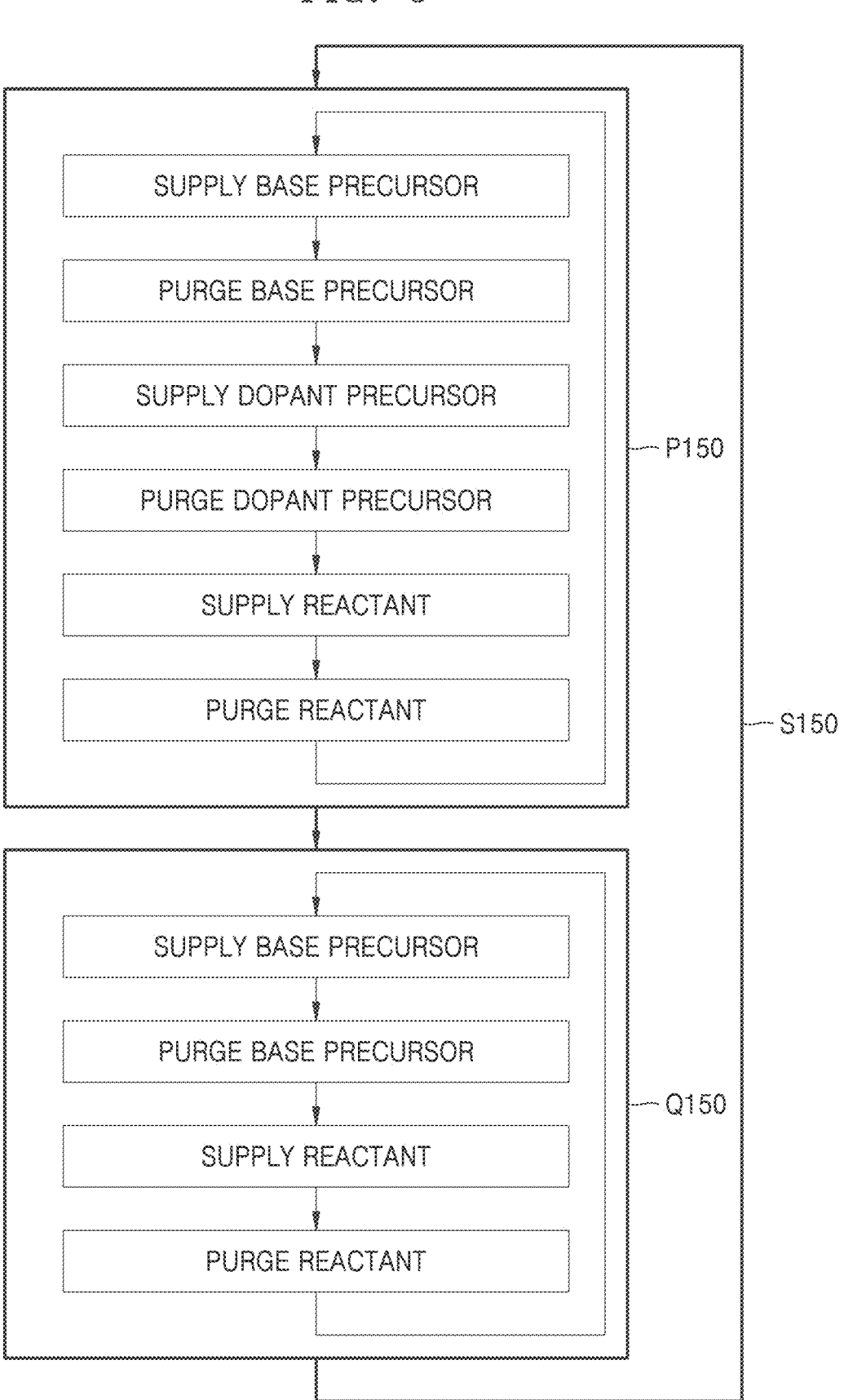

Referring to FIG. 9, operation S150 of forming the doped upper interface film in the method S10 may include a first ALD process P150 and a second ALD process Q150.

The first ALD process P150 may include a cycle of supplying and purging a base precursor, supplying and purging a dopant precursor, and supplying and purging a reactant.

For example, the base precursor may be supplied to a lower layer to be adsorbed to the surface of the lower layer. Thus, self-organized and oriented adsorption of the base precursor may be performed on the surface of the lower layer. Because of the chemosystematic characteristics of the base precursor, the base precursor may not completely cover the surface of the lower layer. Therefore, a gap may be formed on the surface of the lower layer. The gap may remain even after a non-adsorbed portion of the base precursor is removed by purge and act as an adsorption site of a dopant precursor.

Thereafter, a dopant precursor may be supplied to the lower layer to be adsorbed to a surface of the lower layer, which is exposed by the gap. Thus, the dopant precursor adsorbed to the gap may remain even after a non-adsorbed portion of the dopant precursor is removed by purge and is stably adsorbed to the surface of the lower layer.

Thereafter, a reactant may be supplied to the adsorbed base precursor and dopant precursor. As such, the base precursor and the dopant precursor may decompose into a first atomic layer. An unreacted portion of the reactant and a by-product may be purged such that a first cycle is completed.

Consequently, the first atomic layer constituted of mainly a base material and a very small amount of dopants may be formed. Here, the base material may include the base material BM (see FIG. 2) described above, and the dopants may include the dopants DP (see FIG. 2) described above. To control the concentration of dopants, the first cycle may be repeatedly performed A times (where A is a natural number).

The second ALD process Q150 may include a cycle of supplying and purging a base precursor and supplying and purging a reactant.

For example, the base precursor may be supplied to the first atomic layer to be adsorbed to the surface of the first atomic layer. A non-adsorbed portion of the base precursor is removed by purge. Thus, self-organized and oriented adsorption of the base precursor may be performed on the surface of the first atomic layer.

Thereafter, a reactant may be supplied to the adsorbed base precursor. As such, the base precursor may decompose into a second atomic layer. An unreacted portion of the reactant and a by-product may be purged such that a second cycle is completed.

Consequently, the second atomic layer constituted of a base material may be formed on the first atomic layer. To obtain a desired thickness of the base material, the second cycle may be repeatedly performed B times (where B is a natural number).

In the method S10 according to some example embodiments of the inventive concepts, the first and second ALD processes P150 and Q150 may be repeatedly performed C times (where C is a natural number) to form the doped upper interface film 182 (see FIG. 2) to a desired thickness.

Figure 10:
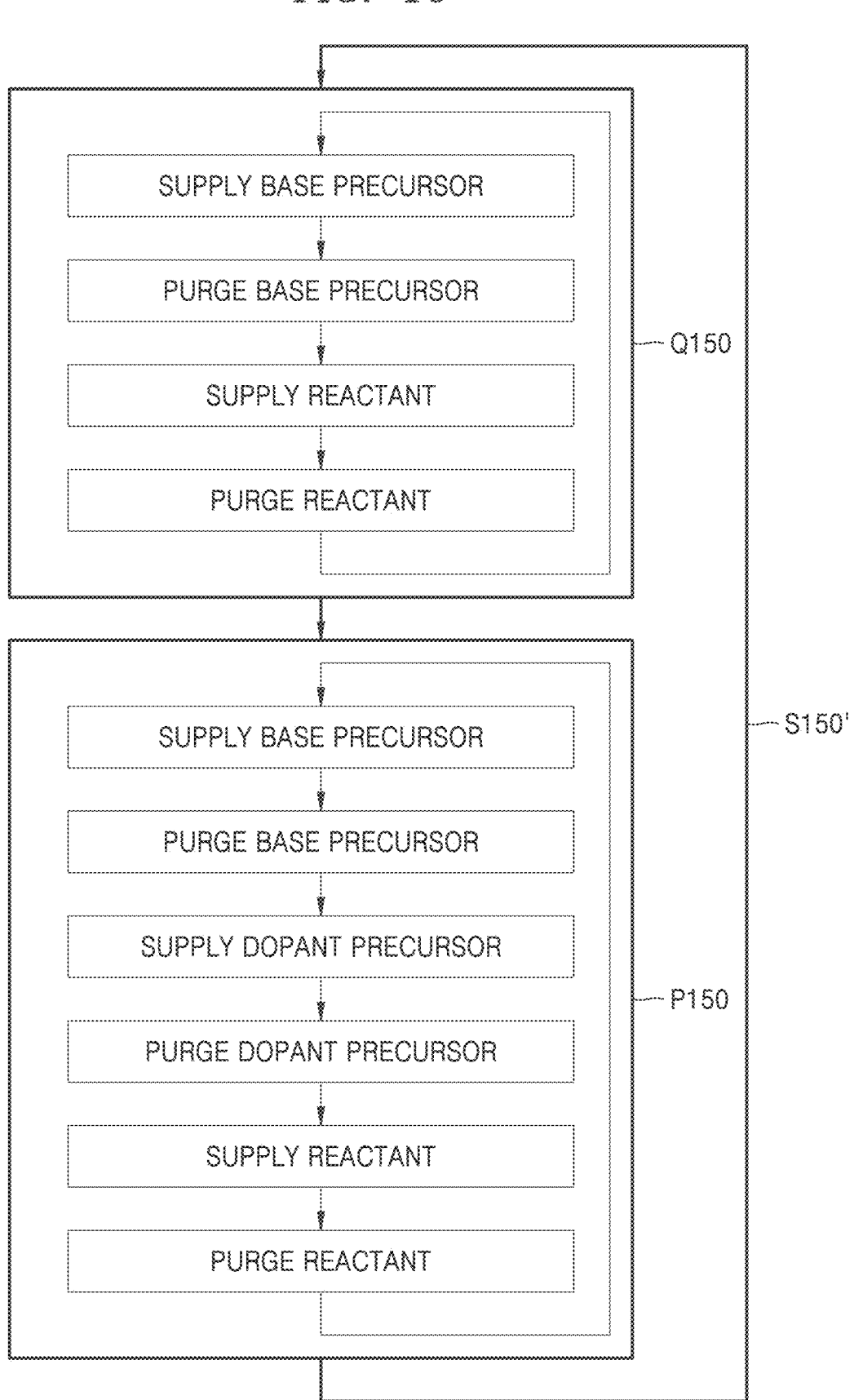

Referring to FIG. 10, operation S150' of forming a doped upper interface film in the method S10 may include a first ALD process Q150 and a second ALD process P150.

The first ALD process Q150 may include a cycle of supplying and purging a base precursor and supplying and purging a reactant.

The second ALD process P150 may include a cycle of supplying and purging a base precursor, supplying and purging a dopant precursor, and supplying and purging a reactant.

In other words, the first and second ALD processes P150 and Q150 in operation S150 described above may be performed in reverse order in operation S150'. Apart from this, operation S150' is the same as or substantially similar to operation S150, and thus, detailed descriptions thereof are omitted.

Figure 11:
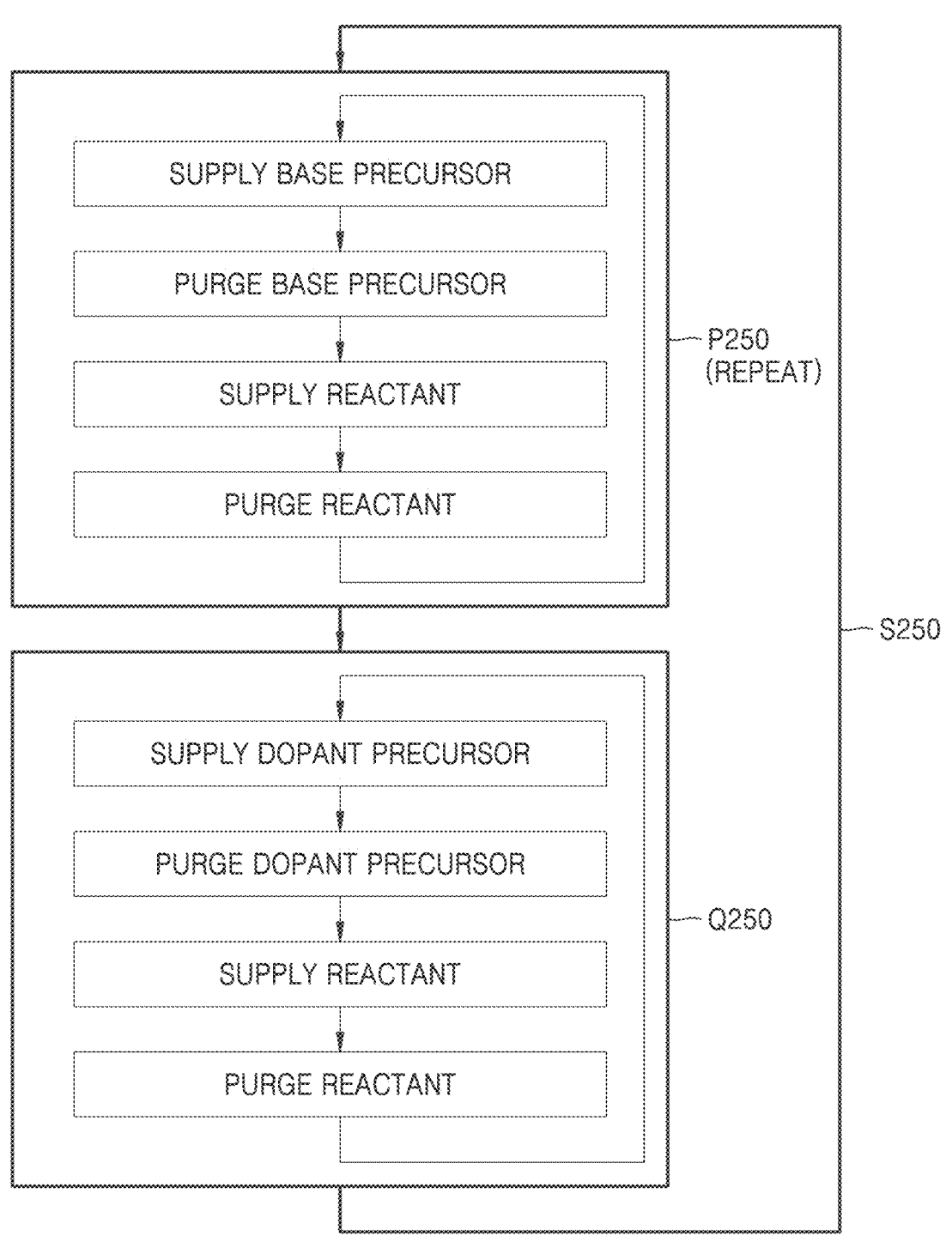

Referring to FIG. 11, operation S250 of forming a doped upper interface film in the method S10 may include a first ALD process P250 and a second ALD process Q250.

The first ALD process P250 may include a supercycle of supplying and purging a base precursor and supplying and purging a reactant.

For example, the base precursor may be supplied to a lower layer to be adsorbed to the surface of the lower layer, and a non-adsorbed portion of the base precursor is removed by purge. Thus, self-organized and oriented adsorption of the base precursor may be performed on the surface of the lower layer.

Thereafter, a reactant may be supplied to the adsorbed base precursor. As such, the base precursor may decompose into a first atomic layer. An unreacted portion of the reactant and a by-product may be purged such that a first supercycle is completed.

Consequently, the first atomic layer constituted of a base material may be formed on the lower layer. To form the base material to a desired thickness, the first supercycle may be repeatedly performed multiple times.

The second ALD process Q250 may include a supercycle of supplying and purging a dopant precursor and supplying and purging a reactant.

For example, the dopant precursor may be supplied to a base material layer to be adsorbed to the surface of the base material layer, and a non-adsorbed portion of the dopant precursor is removed by purge. Thus, self-organized and oriented adsorption of the dopant precursor may be performed on the surface of the base material layer.

Thereafter, a reactant may be supplied to the adsorbed dopant precursor. As such, the dopant precursor may decompose into a second atomic layer. An unreacted portion of the reactant and a by-product may be purged such that a second supercycle is completed.

Consequently, the second atomic layer constituted of a dopant material may be formed on the base material layer. For the doping of a very small amount of dopants, the second supercycle may be performed once. In other words, a single layer of dopants may be formed on the base material layer having a certain thickness.

In the method S10 of manufacturing an integrated circuit device according to some example embodiments of the inventive concepts, the first and second ALD processes P250 and Q250 may be repeatedly performed multiple times so as to form the doped upper interface film 282 (see FIG. 6) to a desired thickness. In other words, the dopants DP (see FIG. 6) may form layers at regular intervals in the base material BM (see FIG. 6).

FIGS. 12 to 19 are cross-sectional views of stages in a method of manufacturing an integrated circuit device, according to an example embodiment.

For convenience of descriptions, FIGS. 12 to 19 are cross-sectional views taken along the line II-IT in FIG. 1.

Figure 12:
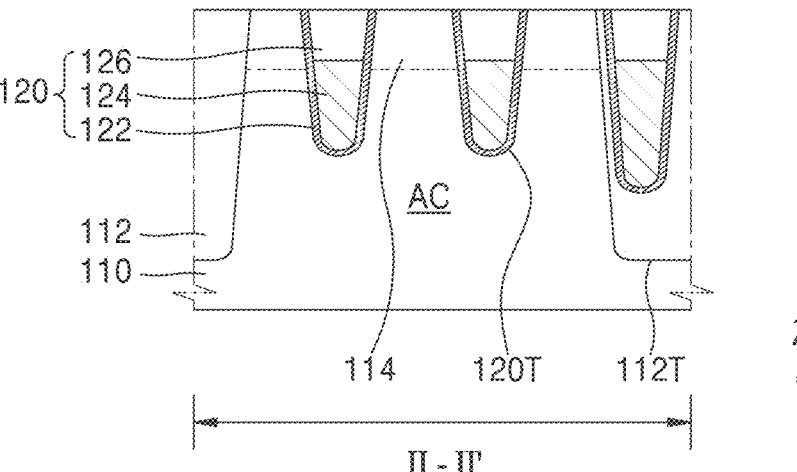
FIGS. 12 to 19 are cross-sectional views of stages in a method of manufacturing an integrated circuit device, according to an example embodiment.
Figure 12:
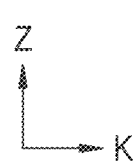

Referring to FIG. 12, the isolation trench 112T may be formed in the substrate 110, and the isolation film 112 defining the active region AC may be formed in the isolation trench 112T.

Subsequently, a mask pattern (not shown) may be formed on the substrate 110, and a plurality of gate line trenches 120T may be formed in the substrate 110 by using the mask pattern as an etch mask. The gate line trenches 120T may extend in parallel with each other, and each of the gate line trenches 120T may have a line shape crossing the active region AC.

Subsequently, the gate insulating layer 122 may be formed on the inner wall of each of the gate line trenches 120T. The gate electrode layer 124 may be formed by forming a gate conductive layer (not shown) on the gate insulating layer 122 to fill each gate line trench 120T and then removing an upper portion of the gate conductive layer to a certain height using an etch back process.

Subsequently, the gate capping layer 126 may be formed in the gate line trench 120T by forming an insulating material to fill the remaining portion of the gate line trench 120T and planarizing the insulating material to expose the top surface of the substrate 110. At this time, the mask pattern may be removed.

Subsequently, the source/drain region 114 may be formed by implanting impurity ions into a portion of the substrate 110 at each of opposite sides of the gate structure 120. In some example embodiments, the source/drain region 114 may be formed on the active region AC by implanting impurity ions into the substrate 110 after the isolation film 112 is formed.

Figure 13:
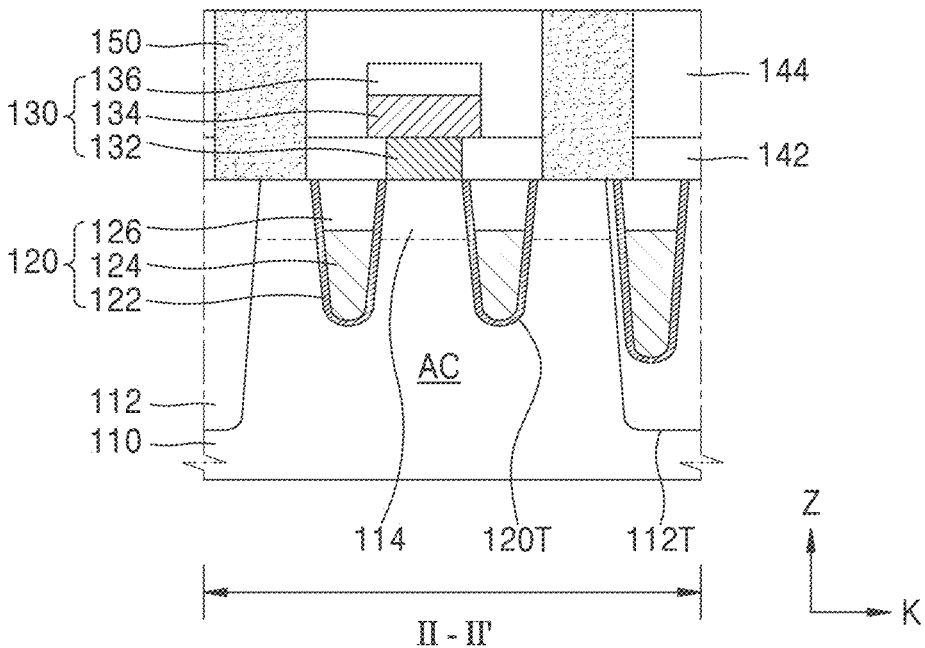

Referring to FIG. 13, the first interlayer insulating film 142 may be formed on the substrate 110, and an opening may be formed in the first interlayer insulating film 142 to expose a top surface of the source/drain region 114.

The bit line contact 132 electrically connected to the source/drain region 114 may be formed in the opening of the first interlayer insulating film 142 by forming a conductive layer on the first interlayer insulating film 142 to fill the opening of the first interlayer insulating film 142 and planarizing an upper portion of the conductive layer.

Subsequently, the bit line 134 and the bit line capping layer 136 may be formed to extend in the Y-direction, which is parallel with the top surface of the substrate 110, by sequentially forming a conductive layer and an insulating layer on the first interlayer insulating film 142 and then patterning the conductive layer and the insulating layer. Although not shown, a bit line spacer may be further formed on the side walls of the bit line 134 and the bit line capping layer 136.

Subsequently, the second interlayer insulating film 144 may be formed on the first interlayer insulating film 142 to cover the bit line 134 and the bit line capping layer 136.

Subsequently, an opening may be formed in the first and second interlayer insulating films 142 and 144 to expose the top surface of the source/drain region 114, and a contact structure 150 may be formed in the opening of the first and second interlayer insulating films 142 and 144. In some example embodiments, the contact structure 150 may be formed by sequentially forming a lower contact (not shown), a metal silicide layer (not shown), and an upper contact (not shown) in the opening of the first and second interlayer insulating films 142 and 144.

Figure 14:
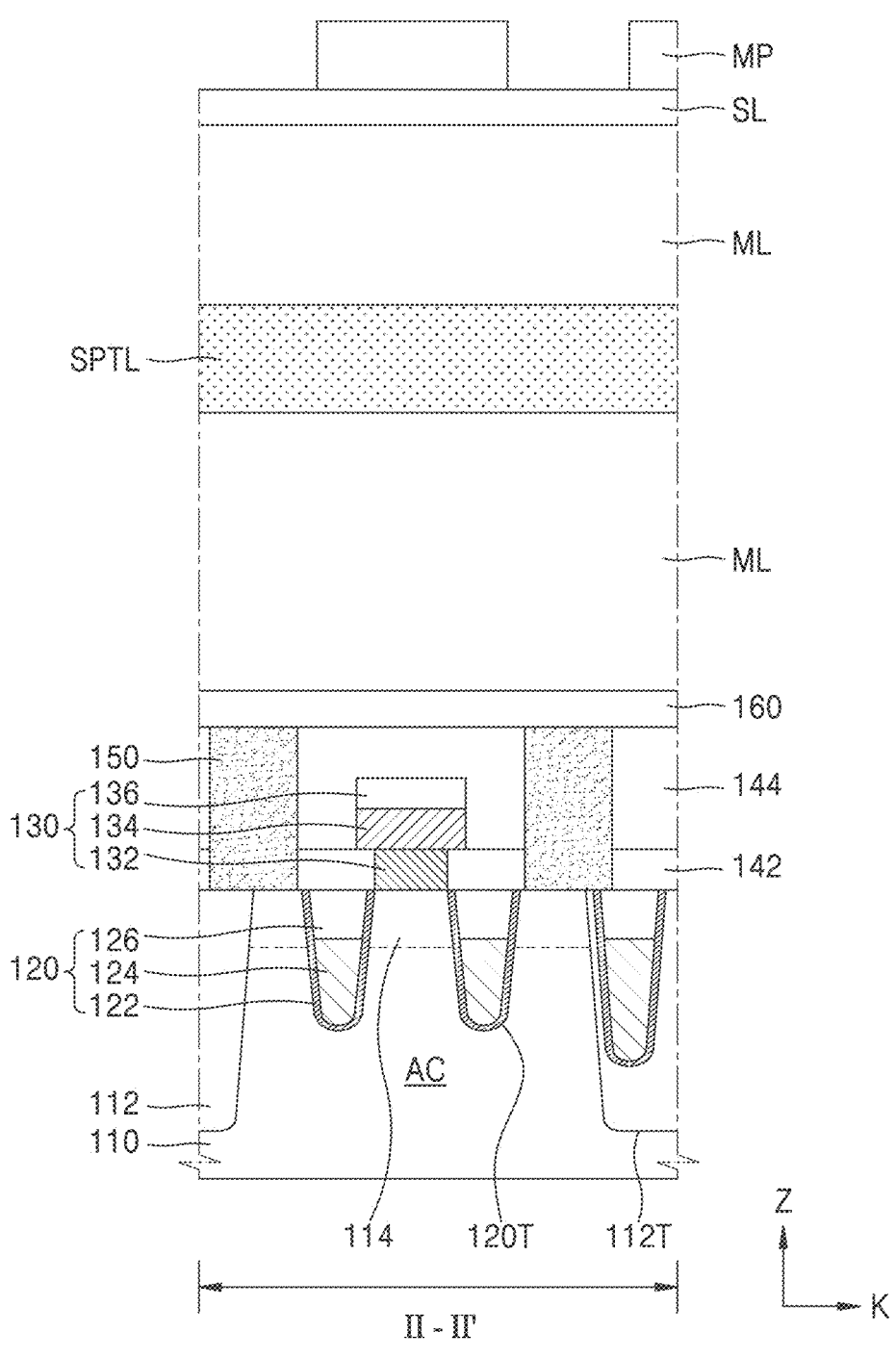

Referring to FIG. 14, the etch stop film 160, a mold layer ML, a supporter forming layer SPTL, and a sacrificial layer SL may be sequentially formed on the second interlayer insulating film 144 and the contact structure 150.

The mold layer ML may include silicon oxide. For example, the mold layer ML may be formed using a material, such as BPSG, spin on dielectric (SOD), PSG, PE-TEOS, or low pressure TEOS (LPTEOS). The mold layer ML may be formed to a thickness of about 500 nm to about 4000 nm but is not limited thereto.

Subsequently, the supporter forming layer SPTL may be formed in the mold layer ML. The supporter forming layer SPTL may include an insulating material, such as silicon oxide, silicon nitride, or silicon oxynitride.

Subsequently, the sacrificial layer SL may be formed on the mold layer ML. For example, the sacrificial layer SL may be formed using a material, such as TEOS, BPSG, PSG, USG, SOD, or high density plasma oxide (HDP). The sacrificial layer SL may be formed to a thickness of about 50 nm to about 200 nm but is not limited thereto.

Subsequently, a mask pattern MP may be formed by applying photoresist to the sacrificial layer SL and patterning the photoresist through exposure and development. A region, in which the lower electrode 170 (see FIG. 17) is to be formed, may be defined by the mask pattern MP. An anti-reflective coating (ARC) (not shown) may also be formed on the sacrificial layer SL.

Figure 15:
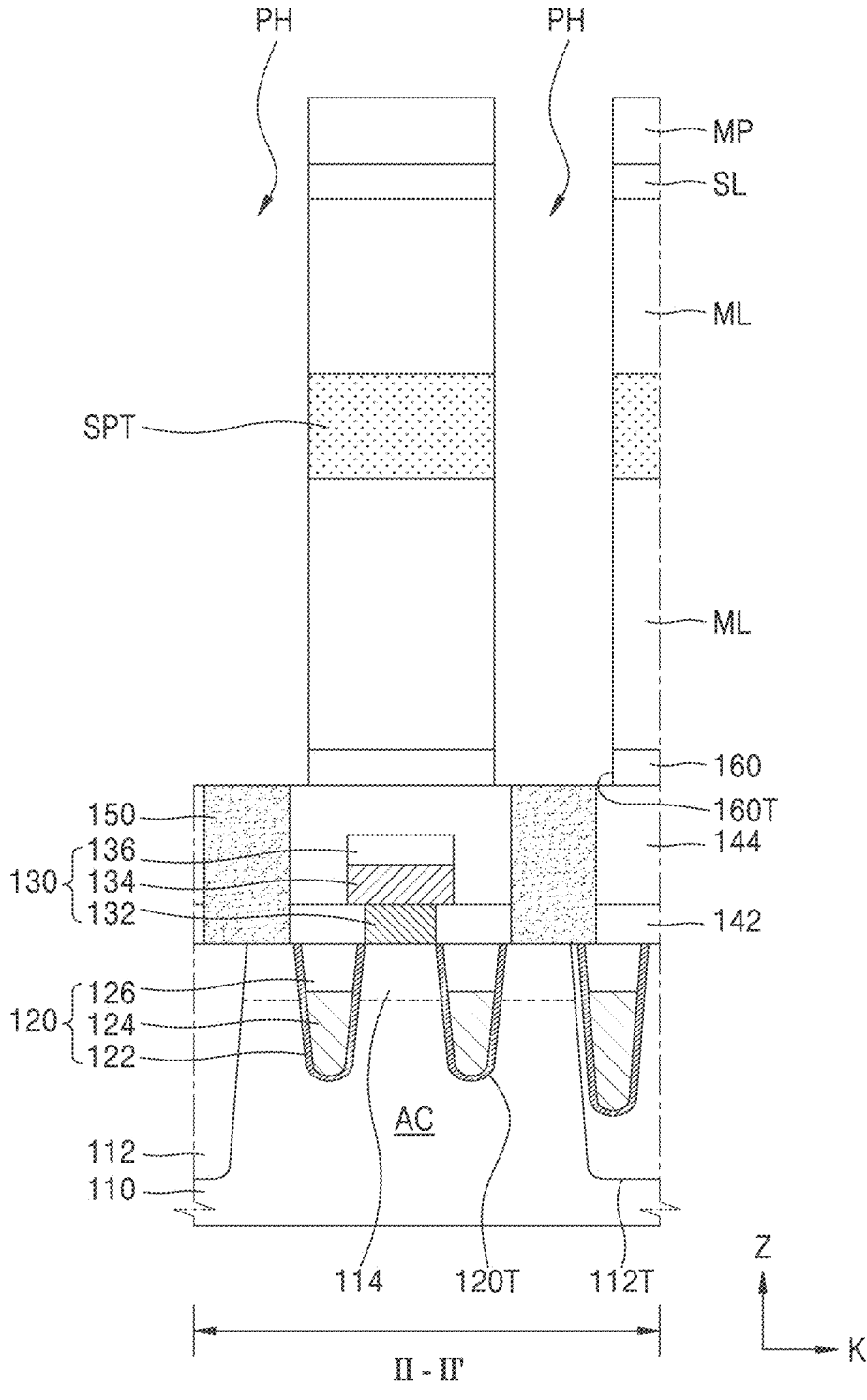

Referring to FIG. 15, a through hole PH may be formed by sequentially etching the sacrificial layer SL, the supporter forming layer SPTL, and the mold layer ML by using the mask pattern MP as an etch mask.

Subsequently, the opening 160T may be formed by removing a portion of the etch stop film 160, which is exposed at the bottom of the through hole PH. The top surface of the contact structure 150 may be exposed by the through hole PH and the opening 160T of the etch stop film 160.

Subsequently, the mask pattern MP may be removed by ashing and stripping processes.

Figure 16:
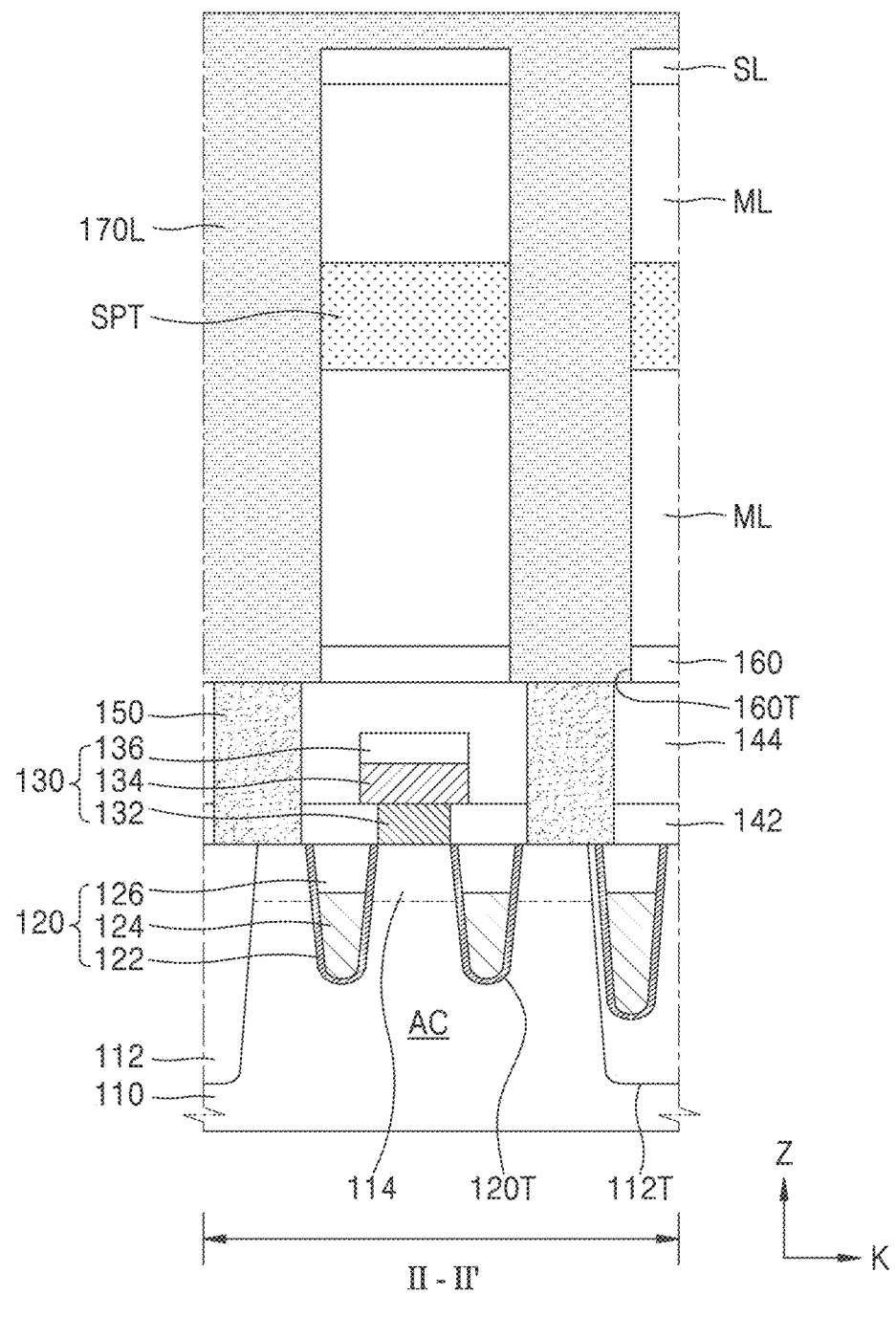

Referring to FIG. 16, a lower electrode forming layer 170L may be formed to conformally cover the inner walls of the through hole PH and the opening 160T of the etch stop film 160.

In some example embodiments, the lower electrode forming layer 170L may be formed on the side surfaces of the etch stop film 160, the side surfaces of the mold layer ML, the side surfaces of the supporter forming layer SPTL, and the side and top surfaces of the sacrificial layer SL so as to be in contact with the top surface of the contact structure 150. For example, the lower electrode forming layer 170L may be formed using CVD or ALD.

Figure 17:
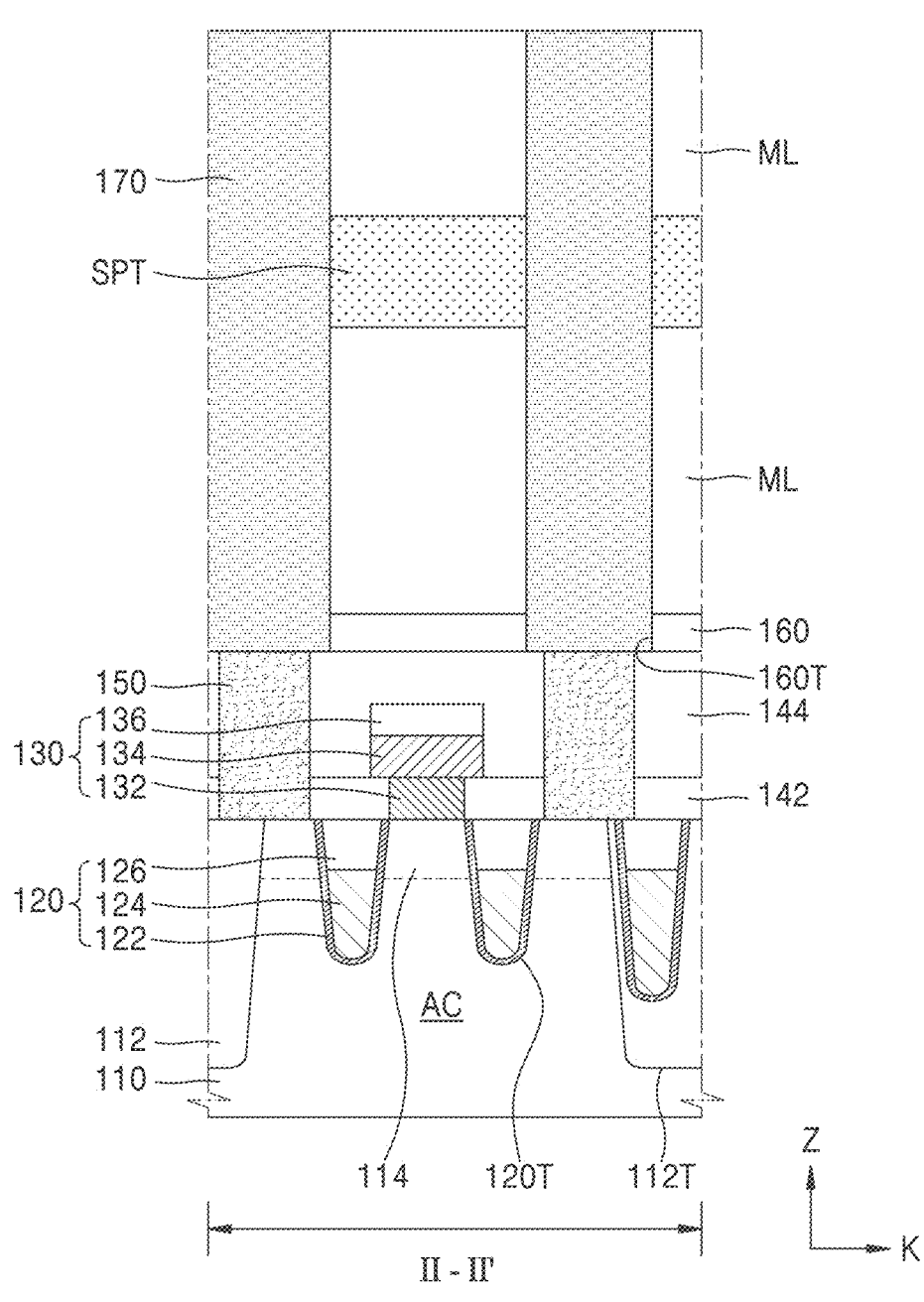

Referring to FIG. 17, the lower electrode 170 may be formed by removing a portion of the lower electrode forming layer 170L (see FIG. 16), which is above the top surface of the mold layer ML, and the sacrificial layer SL (see FIG. 16) by using a node separation process.

The node separation process may remove the sacrificial layer SL through etch back or chemical mechanical polishing (CMP).

Subsequently, the mold layer ML may be removed. For example, when the mold layer ML includes silicon oxide, the mold layer ML may be completely removed by a wet etching process using hydrofluoric acid or buffered oxide etchant (BOE).

During the wet etching process, the supporter SPT may not be etched but remain and firmly support the lower electrode 170, thereby mitigating or preventing the lower electrode 170 from collapsing or breaking. The lower electrode 170 may be formed on the contact structure 150 to have a pillar shape extending in a Z-direction that is perpendicular to the top surface of the substrate 110.

Figure 18:
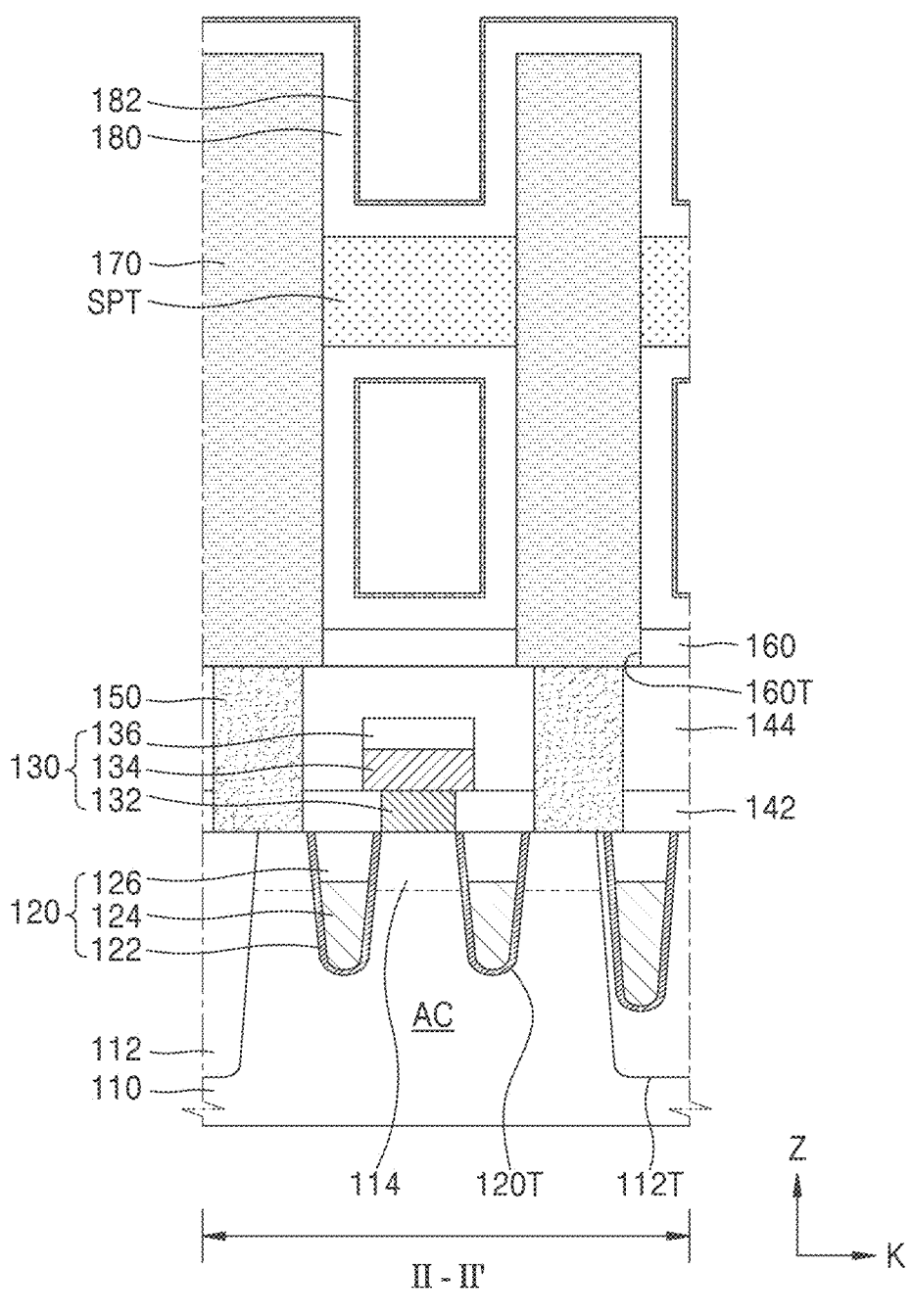

Referring to FIG. 18, the dielectric film 180 may be formed on the outer surfaces of the lower electrode 170 and the supporter SPT.

The dielectric film 180 may be formed using a high-k material having a higher dielectric constant than silicon oxide. For example, the dielectric film 180 may have a dielectric constant of about 10 to about 25. For example, the dielectric film 180 may include $ZrO_2$.

Subsequently, the doped upper interface film 182 may be formed to conformally surround the dielectric film 180. For example, the doped upper interface film 182 may be formed at the interface between the dielectric film 180 and the upper electrode 190.

In an example embodiment, the doped upper interface film 182 may be formed by alternately performing first and second ALD processes, which include different precursors from each other, or performing an ALD process including a supercycle, as described above, such that the doped upper interface film 182 includes a very small amount of dopants.

Figure 19:
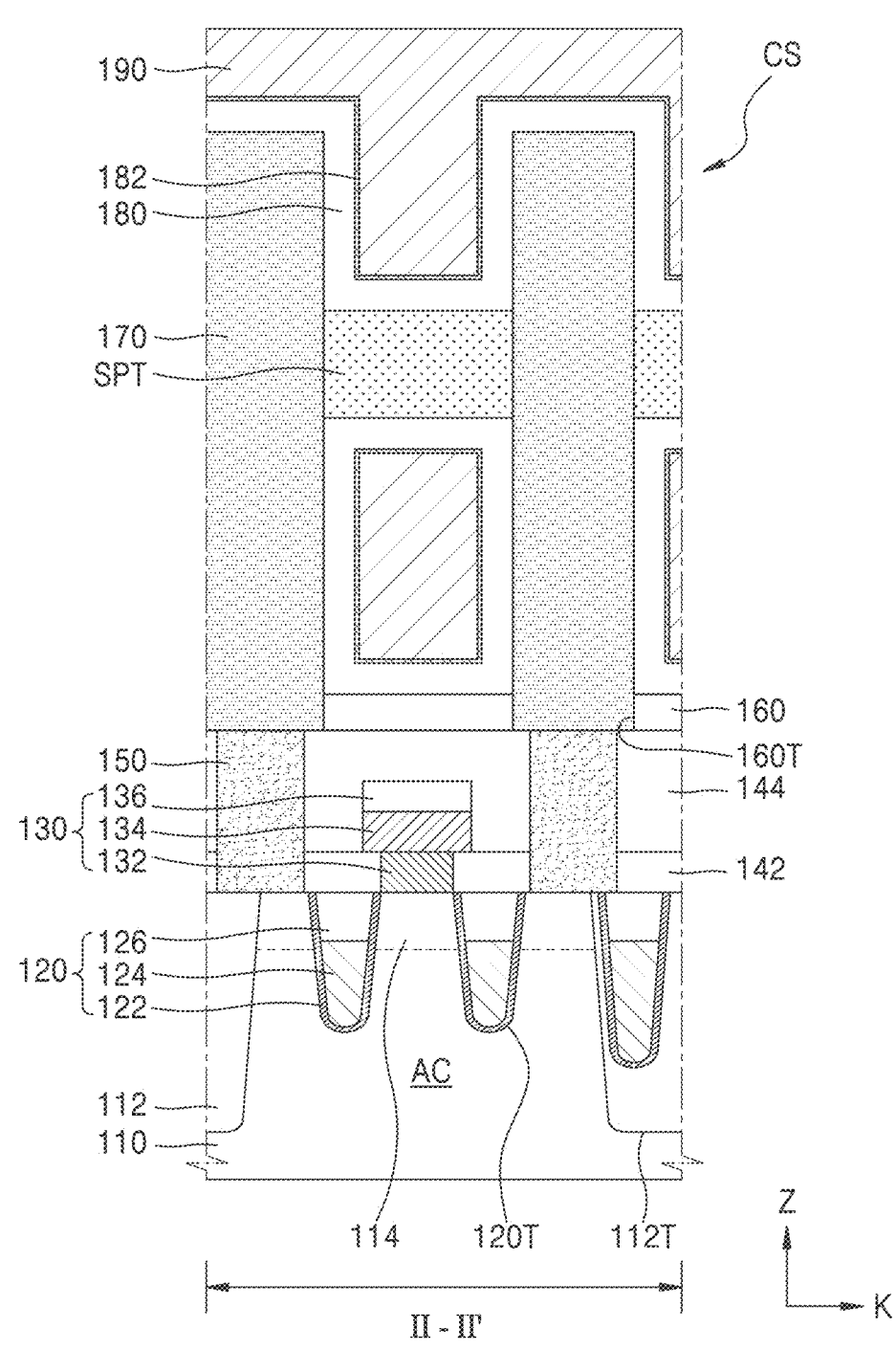

Referring to FIG. 19, the upper electrode 190 may be formed on the doped upper interface film 182.

The upper electrode 190 may be formed on the doped upper interface film 182 so as to completely fill the space defined by neighboring lower electrodes 170.

In some example embodiments, the upper electrode 190 may be formed to be in direct contact with the doped upper interface film 182. The upper electrode 190 may include metal nitride, metal, or a combination thereof. For example, the upper electrode 190 may include at least one selected from TiN, TaN, WN, Ru, Pt, and Ir.

The integrated circuit device 10 may be completely formed by sequentially performing the processes described above.

Eventually, leakage current flowing through the dielectric film 180 between the lower electrode 170 and the upper electrode 190 may be reduced in the integrated circuit device 10 by forming the doped upper interface film 182 at the interface between the dielectric film 180 and the upper electrode 190 by using ALD, in which a very small amount of dopants DP may be supplied as a precursor.

Figure 20:
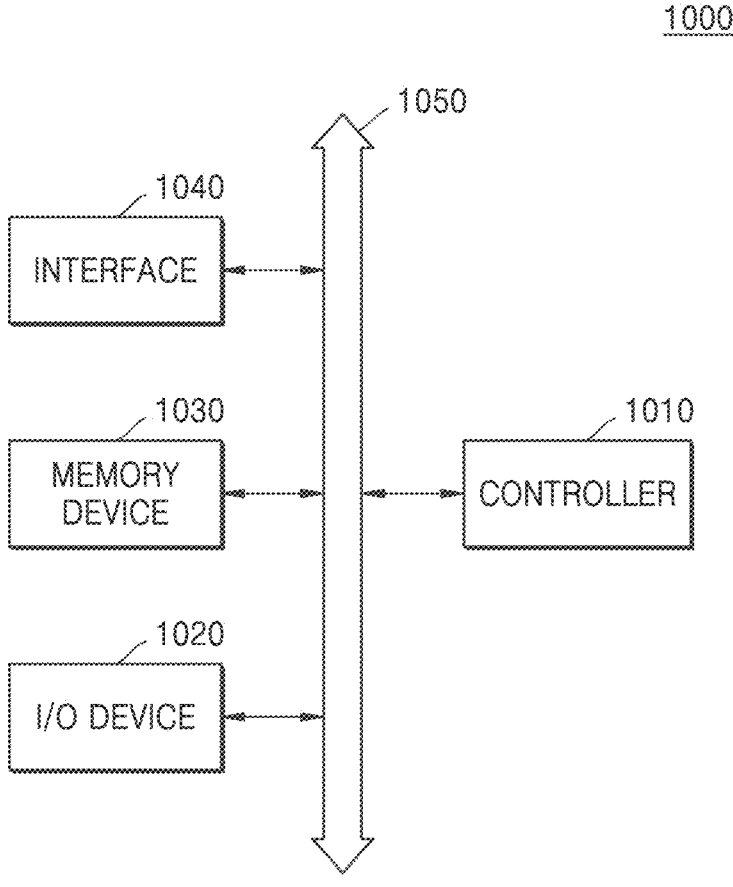
FIG. 20 is a block diagram of a system including an integrated circuit device, according to an example embodiment.

FIG. 20 is a block diagram of a system 1000 including an integrated circuit device, according to an example embodiment.

Referring to FIG. 20, the system 1000 may include a controller 1010, an input/output (I/O) device 1020, a memory device 1030, an interface 1040, and a bus 1050.

The system 1000 may include a mobile system or a system transmitting or receiving information. In some example embodiments, the mobile system may include a portable computer, a web tablet, a mobile phone, a digital music player, or a memory card.

The controller 1010 may control an executable program in the system 1000 and include a microprocessor, a digital signal processor, a microcontroller, or the like.

The I/O device 1020 may be used for data input or output of the system 1000. The system 1000 may be connected to and exchange data with an external device (e.g., a personal computer (PC)) or a network, using the I/O device 1020. For example, the I/O device 1020 may include a touch screen, a touch pad, a keyboard, or a display.

The memory device 1030 may store data for the operation of the controller 1010 or data that has been processed by the controller 1010. The memory device 1030 may include the integrated circuit device 10, 20, or 30 described above according to some example embodiments of the inventive concepts.

The interface 1040 may correspond to a data transmission passage between the system 1000 and an external device. The controller 1010, the I/O device 1020, the memory device 1030, and the interface 1040 may communicate with one another through the bus 1050.

Any functional blocks shown in FIG. 20 may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:

1. A method of manufacturing an integrated circuit device, the method comprising:
   forming a plurality of lower electrodes above a substrate;
   forming a dielectric film on the plurality of lower electrodes;
   forming a doped upper interface film on the dielectric film; and
   forming an upper electrode on the doped upper interface film,
   wherein the doped upper interface film includes a dopant, and
   the dopant includes one selected from tin (Sn), molybdenum (Mo), niobium (Nb), tantalum (Ta), and aluminum (Al),
   the doped upper interface film is formed by alternately performing a first atomic layer deposition process and a second atomic layer deposition process,
   the first atomic layer deposition process includes a first cycle of supplying and purging a base precursor, supplying and purging a dopant precursor, and supplying and purging a reactant, and
   the second atomic layer deposition process includes a second cycle of supplying and purging the base precursor and supplying and purging the reactant.

2. The method of claim 1, wherein the doped upper interface film includes, as a base material, one selected from $InO_x$, $TiO_x$, $SnO_x$, and $ZnO_x$.

3. The method of claim 2, wherein the doped upper interface film corresponds to a transparent electrode.

4. The method of claim 1, wherein
   the first atomic layer deposition process is repeatedly performed A times in a first process,
   the second atomic layer deposition process is repeatedly performed B times in a second process, and
   the forming the doped upper interface film includes repeatedly performing C times the first process and the second process,
   where each of A, B, and C is a natural number.

5. The method of claim 1, wherein
   the second atomic layer deposition process is repeatedly performed A times in a first process,
   the first atomic layer deposition process is repeatedly performed B times in a second process, and
   the forming the doped upper interface film includes repeatedly performing C times the first process and the second process,
   where each of A, B, and C is a natural number.

6. The method of claim 1, wherein
   a thickness of the doped upper interface film is less than a thickness of the dielectric film, and
   the thickness of the doped upper interface film is less than or equal to 1 nm.

7. The method of claim 1, wherein the doped upper interface film has a work function greater than 4 eV.

8. A method of manufacturing an integrated circuit device, the method comprising:
   forming a plurality of lower electrodes above a substrate;
   forming a supporter configured to support the plurality of lower electrodes;
   forming a dielectric film on the plurality of lower electrodes and the supporter;
   forming a doped upper interface film on the dielectric film; and
   forming an upper electrode on the doped upper interface film,
   wherein the doped upper interface film includes one selected from $InO_x$ doped with tin (Sn), $TiO_x$ doped with niobium (Nb), $SnO_x$ doped with tantalum (Ta), $TiO_x$ doped with Ta, and $TiO_x$ doped with molybdenum (Mo),
   the doped upper interface film is formed by alternately performing a first atomic layer deposition process and a second atomic layer deposition process,
   the first atomic layer deposition process includes a first cycle of supplying and purging a base precursor, supplying and purging a dopant precursor, and supplying and purging a reactant, the first cycle being performed multiple times, and
   the second atomic layer deposition process includes a second cycle of supplying and purging the base precursor and supplying and purging the reactant, the second cycle being performed multiple times.

9. The method of claim 8, wherein the doped upper interface film corresponds to a transparent electrode having a work function greater than 4 eV.

10. A method of manufacturing an integrated circuit device, the method comprising:
   forming an isolation film defining an active region in a substrate;
   forming a gate structure crossing the active region and extending in a first direction;
   forming a source/drain in the active region at opposite sides of the gate structure, respectively;
   forming a bit line structure extending in a second direction that is perpendicular to the first direction;

forming a plurality of contact structures on the source/ drain, respectively;

forming a plurality of lower electrodes on the plurality of contact structures, respectively;

forming a supporter configured to support the plurality of lower electrodes;

forming a dielectric film on the plurality of lower electrodes and the supporter;

forming a doped upper interface film on the dielectric film; and forming an upper electrode on the doped upper interface film, wherein the doped upper interface film includes a dopant, the dopant includes one selected from tin (Sn), molybdenum (Mo), niobium (Nb), tantalum (Ta), and aluminum (Al), the doped upper interface film is formed by alternately performing a first atomic layer deposition process and a second atomic layer deposition process, the first atomic layer deposition process includes a first cycle of supplying and purging a base precursor, supplying and purging a dopant precursor, and supplying and purging a reactant, the first cycle being performed multiple times, and the second atomic layer deposition process includes a second cycle of supplying and purging the base precursor and supplying and purging the reactant, the second cycle being performed multiple times.

11. The method of claim 10, wherein the doped upper interface film includes one selected from Sn-doped $InO_x$, Nb-doped $TiO_x$, Ta-doped $SnO_x$, Ta-doped $TiO_x$, and Mo-doped $TiO_x$.

12. The method of claim 10, wherein the doped upper interface film corresponds to a transparent electrode having a work function greater than 4 eV.

\* \* \* \* \*